(12) United States Patent

Bodenweber et al.

(10) Patent No.: US 7,118,385 B1
(45) Date of Patent: Oct. 10, 2006

(54) APPARATUS FOR IMPLEMENTING A SELF-CENTERING LAND GRID ARRAY SOCKET

(75) Inventors: Paul Bodenweber, Kingston, NY (US); David C. Long, Wappingers Falls, NY (US); Jason S. Miller, Poughkeepsie, NY (US); Robert P. Westerfield, Jr., Montgomery, NY (US); Yuet-Ying Yu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/162,779

(22) Filed: Sep. 22, 2005

(51) Int. Cl.
*H01R 12/00* (2006.01)
(52) U.S. Cl. .................. 439/71; 439/525; 439/374
(58) Field of Classification Search .................. 439/71, 439/525, 68, 70, 17
See application file for complete search history.

(56) References Cited

U.S. PATENT DOCUMENTS

| | | | |
|---|---|---|---|
| 5,290,193 A | 3/1994 | Goff et al. | |
| 5,419,710 A | 5/1995 | Pfaff | |
| 5,731,709 A | 3/1998 | Pastore et al. | |
| 5,811,982 A | 9/1998 | Beaman et al. | |
| 5,914,218 A | 6/1999 | Smith et al. | |
| 6,082,547 A * | 7/2000 | Nentl et al. | 206/724 |
| 6,086,386 A | 7/2000 | Fjelstad et al. | |
| 6,559,665 B1 | 5/2003 | Barabi | |
| 6,570,398 B1 | 5/2003 | Murphy et al. | |
| 6,624,647 B1* | 9/2003 | Adams et al. | 324/755 |
| 6,677,770 B1 | 1/2004 | Frankowsky | |
| 6,811,406 B1 | 11/2004 | Grube | |
| 6,861,862 B1 | 3/2005 | Tate | |
| 6,890,186 B1 | 5/2005 | Chien | |
| 2003/0232520 A1* | 12/2003 | Achammer et al. | 439/71 |
| 2004/0166703 A1* | 8/2004 | McHugh et al. | 439/71 |
| 2005/0020099 A1* | 1/2005 | Brown et al. | 439/71 |
| 2005/0106922 A1 | 5/2005 | Ma | |
| 2005/0124183 A1 | 6/2005 | Hou | |
| 2005/0272279 A1* | 12/2005 | McHugh et al. | 439/71 |
| 2006/0024990 A1* | 2/2006 | Ahmad et al. | 439/71 |

* cited by examiner

*Primary Examiner*—Tulsidas C. Patel
*Assistant Examiner*—Harshad C Patel
(74) *Attorney, Agent, or Firm*—James J. Cioffi; Cantor Colburn LLP

(57) ABSTRACT

A self-aligning socket for an integrated circuit package includes an outer frame and an array of contacts configured for alignment with corresponding conductive pads on the bottom of the integrated circuit package. The outer frame further includes a first plurality of alignment ball bearings configured thereon, the ball bearings mounted on cantilevered spring rods.

17 Claims, 5 Drawing Sheets

APPARATUS FOR IMPLEMENTING A SELF-CENTERING LAND GRID ARRAY SOCKET

BACKGROUND

The present invention relates generally to integrated circuit device mounting assemblies and, more particularly, to an apparatus for implementing a self-centering land grid array (LGA) socket.

Area array socket connectors are an evolving technology in which an electrical interconnection between mating surfaces is provided through a conductive interposer. One significant application of this technology is the socketing of land grid array (LGA) modules directly to a printed wiring board, in which the electrical connection is achieved by aligning the contact array of the two mating surfaces and the interposer, then mechanically compressing the interposer. LGA socket assemblies are prevalent today in the electronics industry, and are commonly used to attach both single chip modules (SCMs) and multi-chip modules (MCMs) to printed wiring boards.

Integrated circuits, such as those mounted in LGA assemblies for example, are commonly tested before installation. Accordingly, test sockets are primarily used to determine whether the integrated circuit functions properly, and can make the required electrical connections to pads or leads on the integrated circuit package. In a test system, the test socket is typically mounted on a test circuit board coupled to a control unit. The test circuit board typically includes electronic interconnects (e.g., thin, narrow conductive strips) for coupling electronic signals between the test socket and a control unit. The control unit, in turn, includes a processor that communicates with a device under test (e.g., a packaged electronic circuit mounted on the test socket) by transmitting electronic signals to the packaged electronic circuit and receiving electronic signals from the packaged electronic circuit.

With such testing, there is a need for repeated, accurate centering of LGA substrates within test sockets. Moreover, the test socket should be able to accommodate variations of ±8 mils or more in substrate size, and must also be easy to load and unload in a manufacturing environment. Currently, conventional sockets (including test sockets) incorporate plastic spring fingers in the support frame thereof. Unfortunately, however, there are several disadvantages associated with the present spring finger design. For example, even where a substrate is properly seated in the socket, there is typically poor tactile feedback for indicating a proper insertion. Furthermore, the insertion of a substrate within a socket can generate plastic debris that contaminates the socket.

Still another consideration is the difficulty associated with loading and unloading substrates; if a substrate is misloaded, one or more spring fingers may easily be sheared off, thereby destroying the socket (since spring fingers cannot be repaired or replaced). Even if not destroyed, the spring fingers are still subject to conditions such as wearing, shaving, and thermal fatigue/stress (due to operating temperatures at about 100° C.). In any case, it is also difficult to balance and adjust the spring rates of machined or molded plastic fingers, which are further subject to spring rate variations caused by material anisotropy. Due to the high friction of spring fingers against a substrate edge, a poor centering capability also results.

In view of the above, it would be desirable to overcome the above described shortcomings by configuring a self-centering LGA socket that (among other aspects) provides ease with respect to loading and unloading substrates (i.e., has low friction), as well as good tactile feedback when the substrate is properly seated therein.

SUMMARY

The above discussed drawbacks and deficiencies of the prior art are overcome or alleviated by a self-aligning socket for an integrated circuit package. In an exemplary embodiment, the socket includes an outer frame and an array of contacts configured for alignment with corresponding conductive pads on the bottom of the integrated circuit package. The outer frame further includes a plurality of alignment ball bearings configured thereon, the ball bearings mounted on cantilevered spring rods.

In another embodiment, a land grid array (LGA) test socket assembly includes a circuit board, and an LGA test socket mounted to the circuit board. The test socket further includes an outer frame and an array of contacts configured for alignment on a first side thereof with corresponding conductive pads on the bottom of an LGA package, and for alignment on a second side thereof with the circuit board. The outer frame further includes a first plurality of alignment ball bearings configured thereon, the ball bearings mounted on cantilevered spring rods. The first plurality of ball bearings are configured to engage outer edges of the LGA package as the LGA package is inserted into the socket.

BRIEF DESCRIPTION OF THE DRAWINGS

Referring to the exemplary drawings wherein like elements are numbered alike in the several Figures.

DETAILED DESCRIPTION

Figure 1:
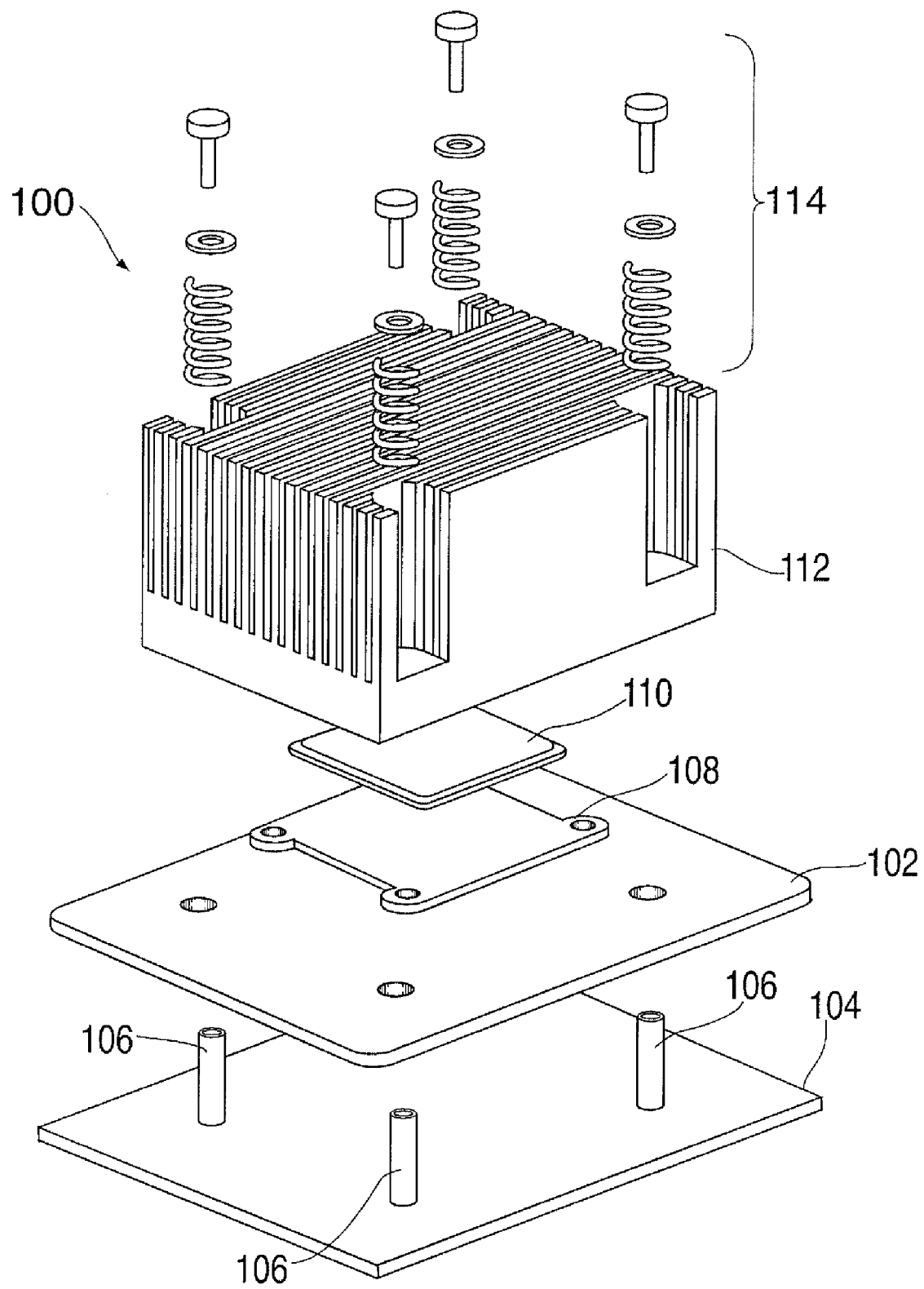
FIG. 1 is an exploded perspective view of a conventional LGA test socket and circuit board assembly.

Referring initially to FIG. 1, there is shown an exploded perspective view of a conventional LGA test socket and circuit board assembly 100 suitable for use in accordance with an embodiment of the invention. As is shown, the test assembly 100 includes a circuit board 102 and a support plate 104 having mounting posts 106 disposed thereon. An LGA test socket 108 is mounted to the circuit board 102, with the test socket 108 configured to receive an LGA package (substrate) 110 therein. As will also be recognized, a heat sink 112 is provided above the LGA package 110, socket 108 and circuit board 102. Suitable mounting hardware 114 is used to secure the individual components in the manner depicted to provide suitable contact pressure between the LGA package 110 and socket 108, as well as between the test socket 108 and the circuit board 102.

Figure 2:
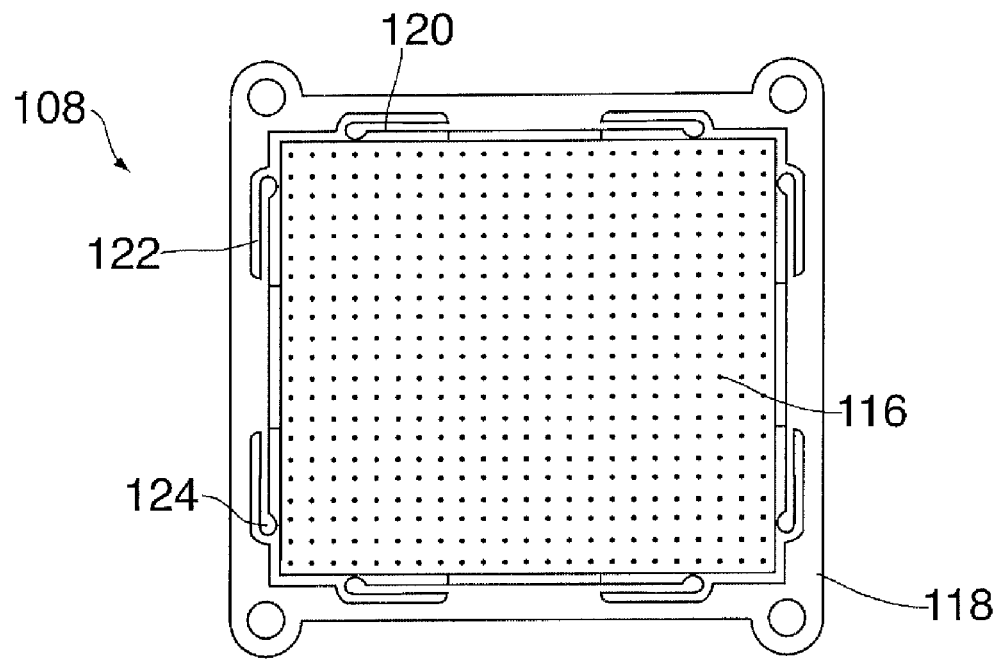
FIG. 2 is a top view of the conventional LGA test socket shown in FIG. 1.

As is shown more particularly in FIG. 2, the test socket 108 includes an array of individual contacts 116 that are configured for alignment with corresponding pads (not shown) on the bottom of the LGA package 110. One disadvantage of the conventional test socket 108, as indicated above, stems from the fact that the outer frame 118 thereof is formed so as to include a plurality of cantilevered spring fingers 120 for receiving the LGA substrate (not shown in FIG. 2) therein. In the example depicted, the spring fingers 120 may be formed by defining a cavity 122 in the outer frame in locations corresponding to where fingers are desired. In addition, rounded tips 124 may also be formed at the free ends of the cantilevered fingers 120. The tips 124 may be separately attached or may be formed as part of the outer frame 118 during a molding process, for example.

As also indicated above, spring fingers of this type are subject to repeated stress, particularly for test sockets that may (over time) have thousands of LGA packages inserted and removed. Any plastic debris from the fingers 120 can have detrimental consequences if the pads become contaminated. Moreover, if the fingers wear unevenly, a slight shift in dimension tolerance could cause shorting across one or more of the socket contacts 116 due to the tight pitch requirements thereof.

Even where the spring fingers 120 are not damaged, worn or broken off completely, they may not provide the desired tactile feedback for determining a proper insertion. For example, a package might be inserted slightly askew in the z-axis direction, which can result in incomplete contact between the contacts on the package and the contacts on the socket. This twisting can also place a mechanical strain on the spring fingers as well.

Figure 3:
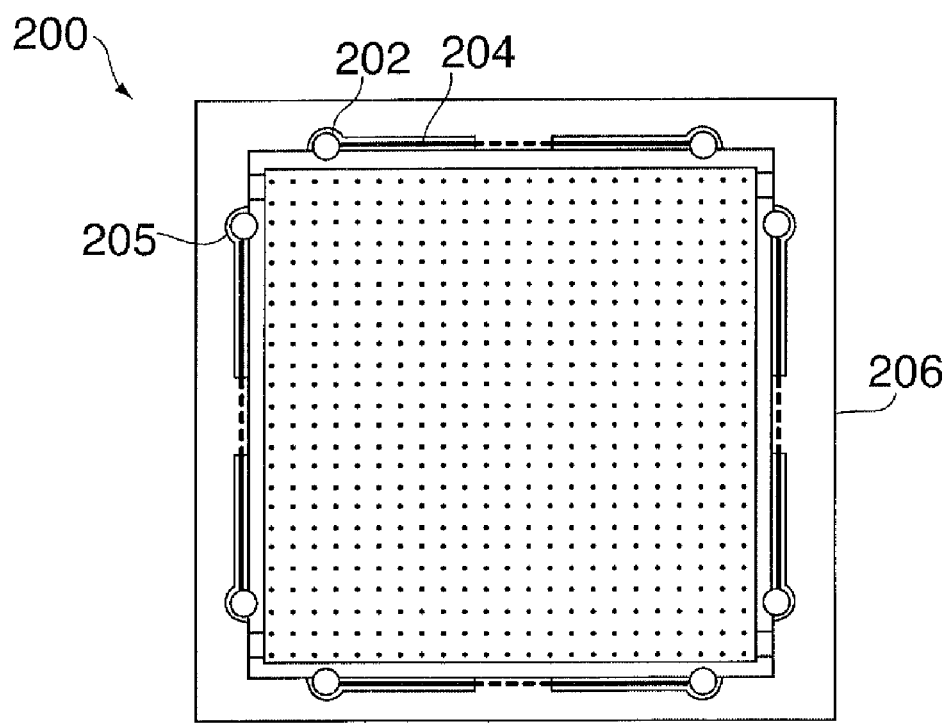
FIG. 3 is a top view of a self-centering LGA socket with ball bearing alignment features, in accordance with an embodiment of the invention.
Figure 4:
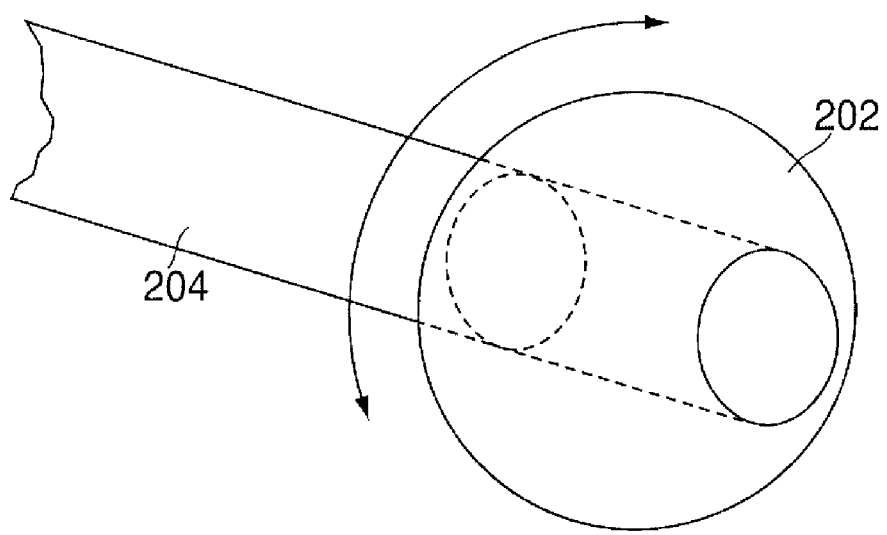
FIG. 4 is a perspective view of an exemplary ball bearing alignment feature of the LGA test socket of FIG. 3.

Therefore, in accordance with an embodiment of the invention, FIG. 3 is a top view of a new, self-centering LGA socket 200 that utilizes ball bearing alignment features. In an exemplary embodiment, ball bearings 202 (with through holes formed therein) are disposed on cantilever spring rods 204. The balls 202 are free to rotate about the longitudinal axis of the round cross-sectional rods 204, as shown more particularly in FIG. 4, and are retained in position near the free ends thereof by cavities 205 formed within the frame 206. Such an alignment feature provides greater ease with respect to loading and unloading LGA substrates from the socket, as there is less friction associated with the free-rotating balls than with plastic tips. Moreover, the ball bearing alignment provides good tactile feedback when an LGA substrate is properly seated in the socket, as the cantilevered rods 204 are also capable of being deflected outward as the substrate is pressed into the socket.

In the embodiment depicted in FIG. 3, there are two bearing/spring assemblies on each side of the frame 206, although a different number could be used. In addition, for each side, a single cantilever rod may be used such that both ends thereof have a ball bearing 202. Alternatively, each side of the frame 206 could be configured to have a separate rod for each bearing.

Figure 5:
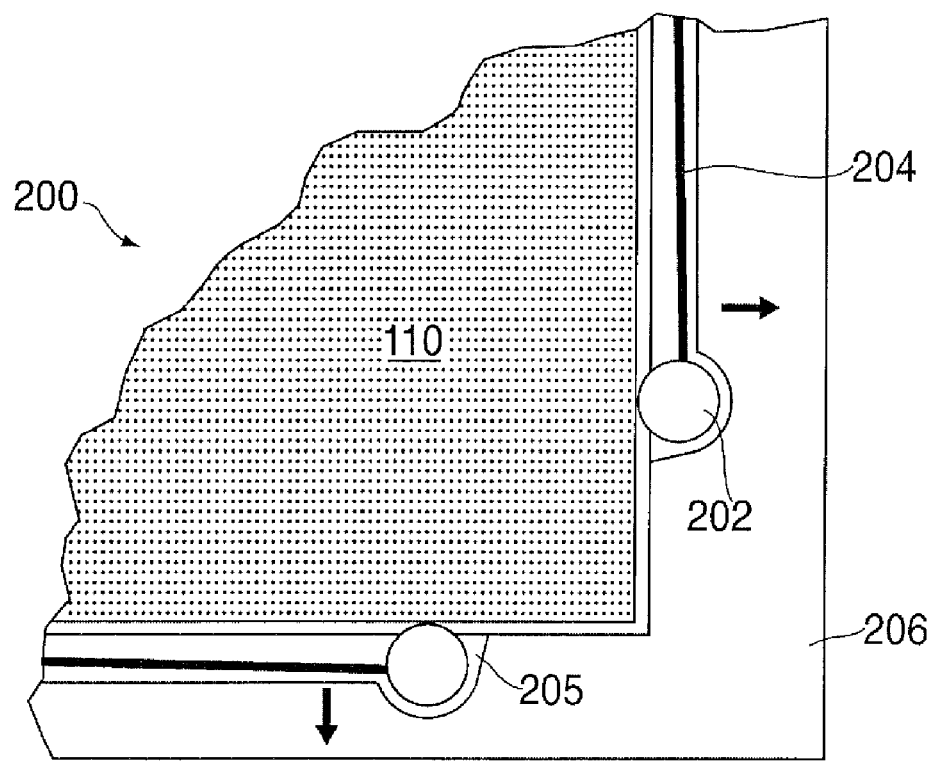
FIG. 5 is a partial top view of the LGA socket of FIG. 3 having an LGA substrate inserted therein.

FIG. 5 is a partial top view of the LGA socket 200 of FIG. 3 having an LGA substrate 110 inserted therein. The rolling ball bearings 202 provide a self-centering, low friction guide in a manner that resists component wear and shaving, and that resists marking of the package. As is also illustrated, the positioning of the LGA substrate 110 in the socket 200 causes a slight outward deflection of the cantilevered rods 204. In order to facilitate the deflection of the cantilevered rods 204 and ball bearings 202, the frame 206 of the socket 200 may be milled out along the interior edges, or could alternatively be molded to accommodate the rod/bearing assembly.

The material used for the ball bearings 202 can be selected from several types including, but not limited to: plastics (e.g., Kapton@, Vespel@, Turcite@, Duratron@), metals (e.g., stainless steel, steel with titanium nitride (TiN), steel with diamond, tungsten carbide, anodized aluminum), ceramics, glass, sapphire, and ruby. In an exemplary embodiment, the ball bearings 202 may have a diameter on the order of about 0.050 inches in diameter to about 0.5 inches in diameter and, more particularly, about 0.125 inches in diameter.

Figure 6A:
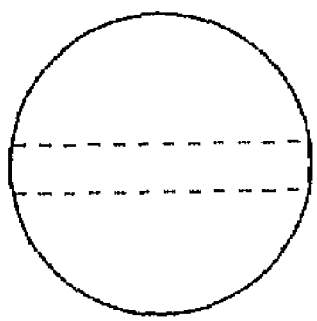
FIGS. 6(a) through 6(d) illustrate various embodiments of ball bearing configurations.
Figure 6B:
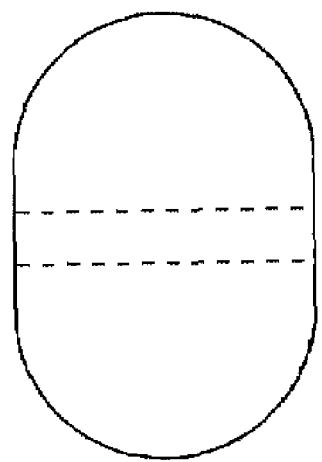
Figure 6C:
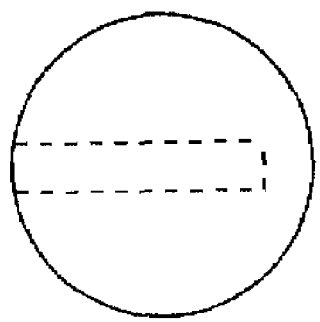
Figure 6D:
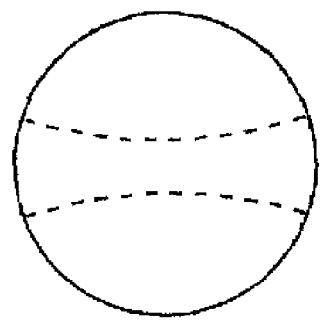

In addition to a spherical shape as shown in FIG. 6(a), the ball bearings may also be barrel shaped as shown in FIG. 6(b). In other words, the bearings are spherical at the point of contact with the LGA package, but are flat where the rod is inserted therethrough. Also, the manner in which the ball bearings 202 are drilled to provide access for the cantilevered rods 204 may vary so as to provide, for example: straight through holes such as shown in FIGS. 6(a) and 6(b); blind holes (i.e., near through holes) such as shown in FIG. 6(c); and hourglass shaped holes for achieving point contact with the cantilevered rod 204 through various deflection angles, such as shown in FIG. 6(d).

A further advantage of the cantilevered rod design is the customizable spring rates that can be easily achieved, since the wiring stock for the rod material is available in 1-mil (0.001 inch) increments. Thus, a different spring rate for the cantilevered rods 204 may be attained simply changing wire diameters. As opposed to a plastic spring configuration, the cantilevered springs of the present embodiment are resistant to damage or breaking. The built in travel limit thereof prevents an overbending of the springs, thus keeping the spring rate substantially constant over the life of the socket. Furthermore, the wire springs are not subject to thermal relaxation (e.g., from annealing or stress relief), nor are they subject to material an isotropy.

Figure 7:
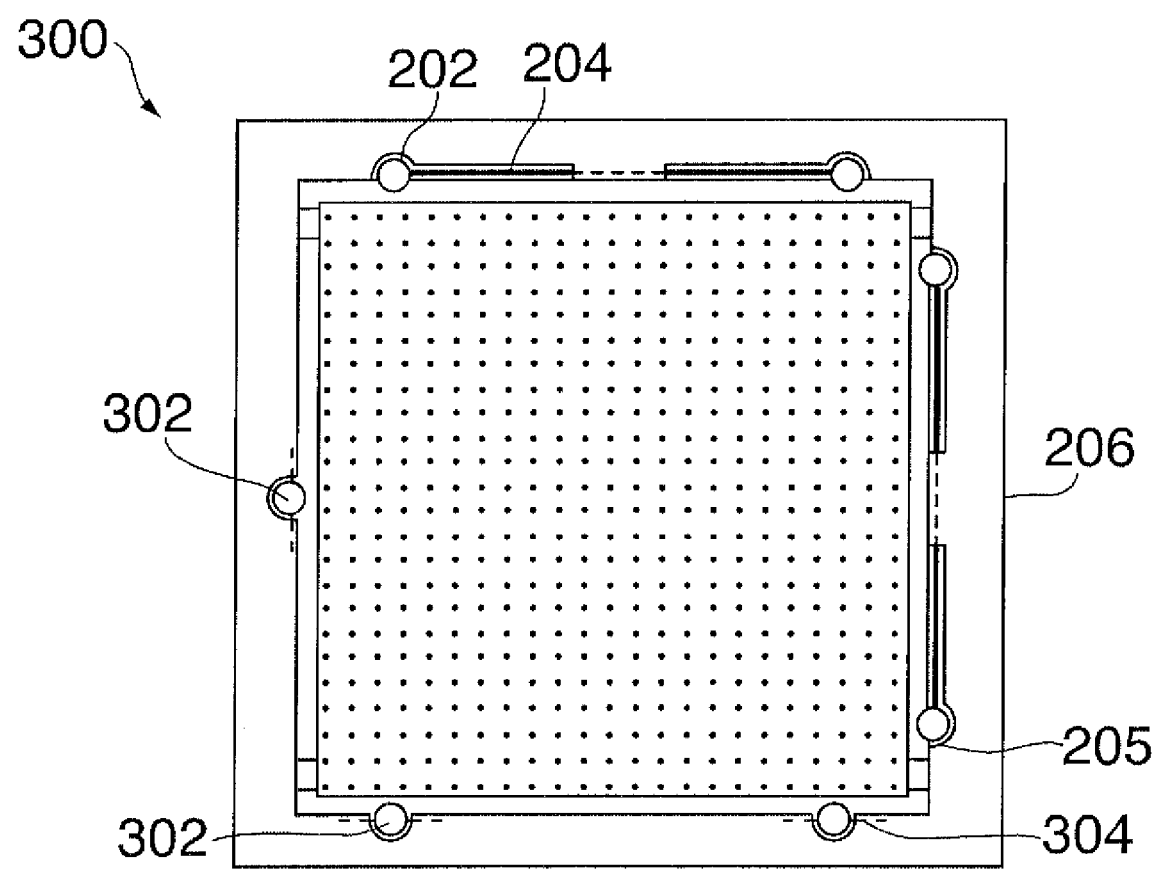
FIG. 7 is a top view of a self-centering LGA socket with ball bearing alignment features, in accordance with an alternative embodiment of the invention.

Finally, FIG. 7 is a top view of a self-centering LGA socket 300 with ball bearing alignment features, in accordance with an alternative embodiment of the invention. In lieu of having cantilevered ball bearing alignment features on all four sides of the outer frame 206, the bottom and left sides of the outer frame (with respect to the view of FIG. 7) incorporate ball bearings 302 mounted on fixed axles 304 to achieve corner banking. The top and right sides of the outer frame 206 still include the ball bearings on cantilevered springs 204, as described above. Corner banking is a known technique in the testing industry and is desirable for certain applications. The side of the LGA substrate in contact with the two bearings 302 on the bottom side of the frame 206 is considered the "banked" side of the substrate, while the corner of the socket 300 defined by the left and bottom sides of the frame 206 is considered the "banked corner." However, with the embodiment of FIG. 7, all of the above described attributes are still maintained while also allowing for a standard corner banking procedure.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A self-aligning socket for an integrated circuit package, comprising:
   an outer frame;
   an array of contacts configured for alignment with corresponding conductive pads on the bottom of the integrated circuit package;
   said outer frame further comprising a first plurality of alignment ball bearings configured thereon, said first plurality of ball bearings mounted on cantilevered spring rods; and
   a second plurality of alignment ball bearings configured on said outer frame, said second plurality of alignment ball bearings mounted on fixed axles with respect to said outer frame, wherein said second plurality of alignment ball bearings are freely rotatable along a longitudinal axis of the corresponding fixed axle mounted thereon.

2. The socket of claim 1, wherein said first plurality of alignment ball bearings are freely rotatable along a longitudinal axis of the corresponding spring rod mounted thereon.

3. The socket of claim 2, wherein said cantilevered spring rods are configured to flex in an outward direction with respect to said outer frame in response to an integrated circuit package inserted therein.

4. The socket of claim 1, wherein said first plurality of alignment ball bearings are configured to engage outer edges of the integrated circuit package as the integrated circuit package is inserted into the socket.

5. The socket of claim 4, wherein said cantilevered spring rods include one of said first plurality of ball bearings disposed on opposite free ends thereof, and said cantilevered spring rods are affixed to said outer frame at a middle portion of said rods.

6. The socket of claim 1, wherein first plurality of alignment ball bearings are formed from one or more of: a plastics material a metal material, a ceramic material, a glass material, a sapphire material and a ruby material.

7. The socket of claim 1, wherein the integrated circuit package is a land grid array (LGA).

8. The socket of claim 2, wherein said first plurality of alignment ball bearings are spherical in shape.

9. The socket of claim 2, wherein said first plurality of alignment ball bearings are barrel shaped, in that said first plurality of alignment ball bearings are spherical at a point of contact with the integrated circuit package and flat at a point of insertion of said cantilevered spring rods therethrough.

10. The socket of claim 2, wherein said cantilevered spring rods are inserted into straight through holes extending completely through the diameter of said first plurality of alignment ball bearings.

11. The socket of claim 2, wherein said cantilevered spring rods are inserted into straight through holes extending partially through the diameter of said first plurality of alignment ball bearings.

12. The socket of claim 2, wherein said cantilevered spring rods are inserted into hourglass shaped through holes extending completely through the diameter of said first plurality of alignment ball bearings.

13. The socket of claim 1, wherein said first plurality of alignment ball bearings are disposed on a first pair of adjacent sides of said outer frame, and said second plurality of alignment ball bearings are disposed on a second pair of adjacent sides of said outer frame, said second pair of adjacent sides being opposite with respect to said first pair of adjacent sides.

14. A land grid array (LGA) test socket assembly comprising:
   a circuit board;
   an LGA test socket mounted to said circuit board, said test socket further comprising an outer frame and an array of contacts configured for alignment on a first side thereof with corresponding conductive pads on the bottom of an LGA package and for alignment on a second side thereof with said circuit board;
   wherein said outer frame further comprises a first plurality of alignment ball bearings configured thereon, said first plurality of alignment ball bearings mounted on cantilevered spring rods, and wherein said first plurality of ball bearings are configured to engage outer edges of said LGA package as said LGA package is inserted into the socket;
   said ball bearings freely rotatable along a longitudinal axis of the corresponding spring rod mounted thereon, and said cantilevered spring rods configured to flex in an outward direction with respect to said outer frame in response to an integrated circuit package inserted therein;
   wherein said first plurality of alignment ball bearings have through holes formed therein for insertion of said cantilevered spring rods, said through further comprising one or more of: straight through holes extending completely through the diameter of said first plurality of alignment ball bearings, straight through holes extending partially through the diameter of said first plurality of alignment ball bearings, and hourglass shaped through holes extending completely through the diameter of said first plurality of alignment ball bearings.

15. A land grid array (LGA) test socket assembly comprising:
   a circuit board;
   an LGA test socket mounted to said circuit board, said test socket further comprising an outer frame and an array of contacts configured for alignment on a first side thereof with corresponding conductive pads on the bottom of an LGA package, and for alignment on a second side thereof with said circuit board;
   wherein said outer frame further comprises a first plurality of alignment ball bearings configured thereon, said first plurality of alignment ball bearings mounted on cantilevered spring rods, and wherein said first plurality of ball bearings are configured to engage outer edges of said LGA package as said LGA package is inserted into the socket; and
   a second plurality of alignment ball bearings configured on said outer frame, said second plurality of alignment ball bearings mounted on fixed axles with respect to said outer frame;
   said second plurality of alignment ball bearings freely rotatable along a longitudinal axis of the corresponding fixed axle mounted thereon;
   wherein said first plurality of alignment ball bearings are disposed on a first pair of adjacent sides of said outer frame, and said second plurality of alignment ball bearings are disposed on a second pair of adjacent sides of said outer frame, said second pair of adjacent sides being opposite with respect to said first pair of adjacent sides.

16. The test socket assembly of claim 15, wherein said cantilevered spring rods include one of said first plurality of ball bearings disposed on opposite free ends thereof, and said cantilevered spring rods are affixed to said outer frame at a middle portion of said rods.

17. The test socket assembly of claim 15, wherein said first plurality of alignment ball bearings are formed from one or more of: a plastics material, a metal material, a ceramic material, a glass material, a sapphire material and a ruby material.

* * * * *